United States Patent [19]

Matsuoka

[11] Patent Number: 5,018,981

[45] Date of Patent: May 28, 1991

[54] CONTACT EQUIPPED WITH A BYPASS ELEMENT

[75] Inventor: Noriyuki Matsuoka, Tokyo, Japan

[73] Assignee: Yamaichi Electric Mfg. Co., Ltd., Tokyo, Japan

[21] Appl. No.: 537,625

[22] Filed: Jun. 13, 1990

[30] Foreign Application Priority Data

Jun. 13, 1989 [JP] Japan .................... 1-150298

[51] Int. Cl.$^5$ .................. H01R 9/09; H01R 31/08
[52] U.S. Cl. ...................... 439/71; 439/72; 439/514
[58] Field of Search .......... 439/68, 70–72, 439/81–83, 514, 516, 876, 889

[56] References Cited

U.S. PATENT DOCUMENTS

| | | | |
|---|---|---|---|
| 4,354,729 | 10/1982 | Grabbe et al. | 439/71 |
| 4,359,252 | 11/1982 | Olsson et al. | 439/71 |
| 4,513,353 | 4/1985 | Bakermans et al. | 439/71 |
| 4,683,423 | 7/1987 | Morton | 439/71 |
| 4,758,176 | 7/1988 | Abe et al. | 439/72 |
| 4,874,333 | 10/1989 | Reed | 439/514 |
| 4,921,430 | 5/1990 | Matsuoka | 439/72 |

FOREIGN PATENT DOCUMENTS

| | | |
|---|---|---|
| 57-21081 | 2/1982 | Japan . |
| 63-117084 | 7/1988 | Japan . |
| 63-164191 | 10/1988 | Japan . |

OTHER PUBLICATIONS

Electronics–Sep. 1986; AMP's New VLSI Package Squeezes in 320 Leeds pp. 46–47.

Primary Examiner—Paula A. Bradley
Attorney, Agent, or Firm—Wenderoth, Lind & Ponack

[57] ABSTRACT

A contact equipped with a bypass element has a contact portion element at one end of a warped element and a male terminal at the other end thereof. The contact comprises a bypass element disposed within the warped element. One end of the bypass element is formed of a rigid portion element and the other end thereof is formed of an elastic portion element. An area at a connecting portion between the rigid portion element and the elastic portion element and a free end of the rigid portion element are contacted with the inner surface between one end and the other end of the warped element to short the circuit between the contact portion element and the male terminal. A free end of the elastic portion element is abutted against an inner surface on the warped side of the warped element in order to elastically support the rigid portion element.

4 Claims, 4 Drawing Sheets

CONTACT EQUIPPED WITH A BYPASS ELEMENT

BACKGROUND OF THE INVENTION

1. Field of the Invention

This invention relates to a contact for connecting an electric part such as an IC package, etc., and particularly to a contact equipped with a bypass element suitable for incurring an electric signal of high frequency.

2. Prior Art

A contact disclosed in Japanese Utility Model Early Laid-open Publication No. Sho 63-117084 is designed such that when a warped element having a contact portion element at one end portion thereof is displaced downward, the contact portion element is abutted against a projecting element on the side of a male terminal disposed on the other end portion of the warped element to elastically displace the projecting element against the spring force, so that the contact portion element and the male terminal are bypassed.

Another contact disclosed in Japanese Patent Early Laid-open Publication No. 57-21081 is designed such that when the contact portion element is displaced, a short element extending from the side of the contact portion element is slide contacted with a spring element extending from the side of a male terminal, so that the contact portion element and the male terminal are bypassed.

Still another contact disclosed in Japanese Utility Model Early Laid-open Publication No. Sho 63-164191 is designed such that a projection element projecting toward a contact portion element side from a male terminal side has no elasticity. An inclined surface is provided on an inner surface of the projection element and on an inner surface of the contact portion element, and when the contact portion element is displaced downward, the inclined surface of the contact portion element is abutted against the inclined surface of the projection element and then displaced backward along the inclined surface on generate a pushing force to the contact portion element and projection element, so that the contact portion element and the male terminal are bypassed.

As the conventional contact of this type inevitably has various tolerances, such as the dimensional tolerance of a contact portion of an objective electric part, dimensional tolerances of a contact and a socket board, etc., irregularity occurs in the displacement amount of the warped element. However, in the contacts of Japanese Utility Model Early Laid-open Publication No. Sho 63-117084 and Japanese Patent Early Laid-open Publication No. Sho 57-21081, the bypass element is provided with the property of a spring, and in the contact of Japanese Utility Model Early Laid-open Publication No. Sho 63-164191, the warped element is elastically displaced in the vertical direction and backward in order to absorb the irregularity in the displacement amount of the warped portion.

However, in Japanese Utility Model Early Laid-open Publication No. Sho 63-117084 and Japanese Patent Early Laid-open Publication No. Sho 57-21081, as the bypass element is warped to provide a spring characteristic, the distance for bypassing the contact portion element and the male terminal is not the shortest. In the case of the latter, the distance for bypassing is merely slightly shorter than the length of the warped element, depending on the irregularity of the displacement amount of the warped element. Besides, the pushing force on the contact portion element owing to elasticity of the bypass element jeopardizes the smooth displacement of the warped element. Accordingly, it is necessary to strictly adjust the elasticity of the bypass element and the warped element, and production is thus difficult.

Also, in Japanese Utility Model Early Laid-open Publication No. Sho 63-164191, it is required to generate contacting force between the contact element of the electric part and the contact portion element of the contact and contacting force between the contact portion element and the projection element by vertical and backward displacement of the warped element. Also, as both the contacting force is difference in direction for having elasticity requested in the warped element, the design of the warped element becomes very difficult. Furthermore, a large load is applied to the warped element. As a result, the mechanical life of the warped element is lowered.

SUMMARY OF THE INVENTION

The present invention has been developed in order to solve the above inconveniences.

In order to solve the above-mentioned inconveniences, there is essentially provided, from one aspect of the invention, a contact equipped with a bypass element having a contact portion element at one end of a warped element and a male terminal at the other end thereof. The contact comprises a bypass element disposed within the warped element, one end of the bypass element being formed of a rigid portion element and the other end thereof being formed of an elastic portion element. An area at a connecting portion between the rigid portion element and the elastic portion element and a free end of the rigid portion element are contacted with the inner surface between one end and the other end of the warped element to short the circuit between the contact portion element and the male terminal. A free end of the elastic portion element is abutted against an inner surface on the warped side of the warped element in order to elastically support the rigid portion element.

From another aspect of the invention, there is also provided a contact equipped with a bypass element having a contact portion element at one end of a warped element and a male terminal at the other end thereof, the contact comprising an elastic bypass element having a horizontal generally V-shaped configuration disposed within the warped element. A bent portion is between a bent element at one end of the horizontal generally V-shaped bypass element and a bent element at the other end thereof and a free end of the bent element at the other end of the bypass element is contacted with and supported by the inner surface between one end and the other end of the warped element in order to short the circuit between the contacting element and the male terminal. The free end of the bent element of the bypass element at the other end thereof is contacted with and supported by the inner surface between one end and the other end of the warped element on the side of the warped portion.

With the above-mentioned construction of the present invention, when a pushing force is applied to the contact portion element by a contact element, the contact portion element is displaced downward against elasticity of the warped element to obtain a contact pressure with the contact element of the electric part, and at the same time a pushing force is applied to three points of the free ends of the bypass element disposed within the warped element, and the connecting portion between the rigid portion element and the elastic portion element, that is, three points of the free end of the rigid portion element, the free end of the elastic portion element and the connecting portion between the two. As a result, a short circuit is obtained between the contact portion element and the male terminal by the rigid portion element while bending the same, and a bypass object can be effectively achieved with the shortest distance by the rigid portion element.

Also, in the invention from another aspect, a pushing force is applied to the three points of both free ends of the horizontal generally V-shaped bypass element and the bent portion by the downward displacement of the warped element and bending is generated while absorbing the elasticity of the warped element. As a result, the bent element at one end of the bypass element is contacted, under pressure, with the inner surface on the side of the contact portion element and the inner surface on the side of the male terminal and a bypass object can be achieved by way of the shortest distance through the bent element.

The above and other objects, characteristic features and advantages of the present invention will become manifest to those skilled in the art from the following description of the invention with reference to the accompanying drawings.

DETAILED DESCRIPTION OF THE EMBODIMENT

Figure 1:
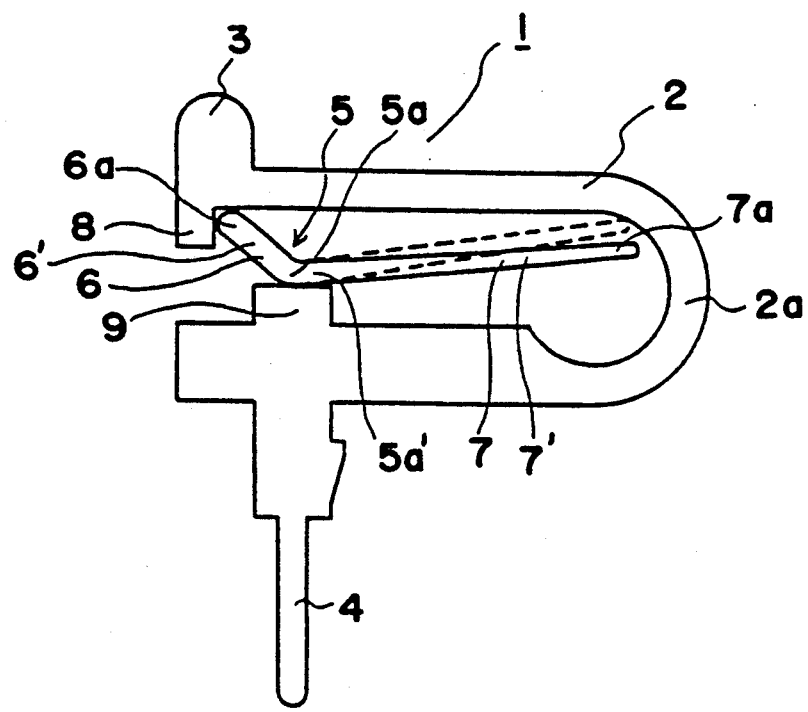
FIG. 1 is a side view of a contact showing one embodiment of the present invention.

Embodiments of the present invention will be described hereinafter with reference to the drawings.

Numeral 1 denotes a contact which is planted in a connector for an electric part. The contact 1 has a contact portion element 3 at one end of a warped or bent element or member 2 and a male terminal 4 at the other end thereof. Numeral 5 denotes a bypass element disposed within the warped element 2.

As is shown in FIGS. 1 through 6, the bypass element 5 is disposed within the warped element 2. One end side of the bypass element 5 is formed of a rigid portion element 6 and the other end side thereof is formed of an elastic portion element 7. The rigid portion element 6 is contacted with the inner surface between one end and the other end of the warped element 2 to short the circuit between the contact portion element 3 and the male terminal 4. At the same time, a free end portion 7a of the elastic portion element 7 extending from the rigid portion element 6 is abutted against the nearby area of the inner surface of a warped or bent portion 2a of the warped or bent element 2 in order to elastically support the rigid portion element 6. That is, the nearby area of the connecting portion between the rigid portion element 6 and the elastic portion element 7 and a free end 6a of the rigid portion element 6 are contacted with the inner surface between one end and the other end of the warped element 2 to short the circuit between the contact portion element 3 and the male terminal 4. At the same time, the free end 7a of the elastic portion element 7 is abutted against the inner surface, in the vicinity of the warped portion, or bent side, 2a, of the warped element 2 to elastically support the rigid portion element 6, and both the free ends 6a and 7a of the bypass element 5 and the connecting portion 5a between the elastic portion element 7 and the rigid portion element 6 are supported on the inner surface of the warped element 2 at three points.

Due to the foregoing, when a pushing force is applied on the contact portion element 3 by a contact element of an electric part, the contact portion element 3 is displaced downward against the resiliency of the warped element 2 to obtain a contact pressure with the contact element of the electric part. At the same time, a pushing force is applied to the three points of both the free ends 6a and 7a of the bypass element 5 disposed within the warped element 2 and the connecting portion between the rigid portion element 6 and the elastic portion element 7, that is, the three points of the free end 6a of the rigid portion element, the free end 7a of the elastic portion element and the connecting portion 5a between the two, and a short circuit between the contact portion element 3 and the male terminal 4 is attained by the rigid portion element 6 while bending the same. By this, the bypass can be effectively achieved by way of the shortest distance through the rigid portion element 6. That is, there can be obtained a contact exhibiting a favorable characteristic with respect to a signal of high frequency.

As one embodiment, as is shown in FIGS. 1 through 5, in the contact 1 having the contact portion element 3 at one end of the warped element 2 and the male terminal 4 at the other end thereof, the bypass element 5 is formed in a horizontal generally V-shaped. The element horizontal generally V-shaped bypass element 5 is disposed within the warped element 2, and a bent portion 5a' between the bent element 6' of one end of the horizontal generally V-shaped bypass element 5 and the bent element 7' at the other end thereof and the free end 6a of the bent element 6' at one end of the bypass element 5 are contacted with and supported by the inner surface between one end and the other end of the warped element 2 in order to short the circuit between the contact portion element 3 and the male terminal 4. At the same time, the free end 7a of the bent element 7' of the bypass element 5 at the other end thereof is contacted with and supported by the inner surface in the vicinity of the warped portion 2a.

In the above-mentioned embodiment, a pushing force is applied to the three points of both the free ends 6a and 7a of the horizontal generally V-shaped bypass element 1 and the bent portion 5a' by the downward displacement of the contact portion element 3 owing to the elastic displacement of the warped element 2 to generate bending while absorbing the elasticity of the warped element 2. And the bent element 7' at one end of the bypass element 5 is contacted, under pressure, with the inner surface on the side on the contact portion element 3 and the inner surface on the side of the male terminal 4, and a bypass can be achieved with the shortest distance by the warped element 2. In the horizontal generally V-shaped bypass element 5 has the bent element 6' formed of a rigid portion element at one end thereof and the warped element 7' formed of an elastic portion element at the other end thereof and provides elasticity in the opening direction and closing direction or otherwise both the warped elements 6' and 7' are formed of an elastic portion element and provide an opening and closing elasticity.

Figure 2:
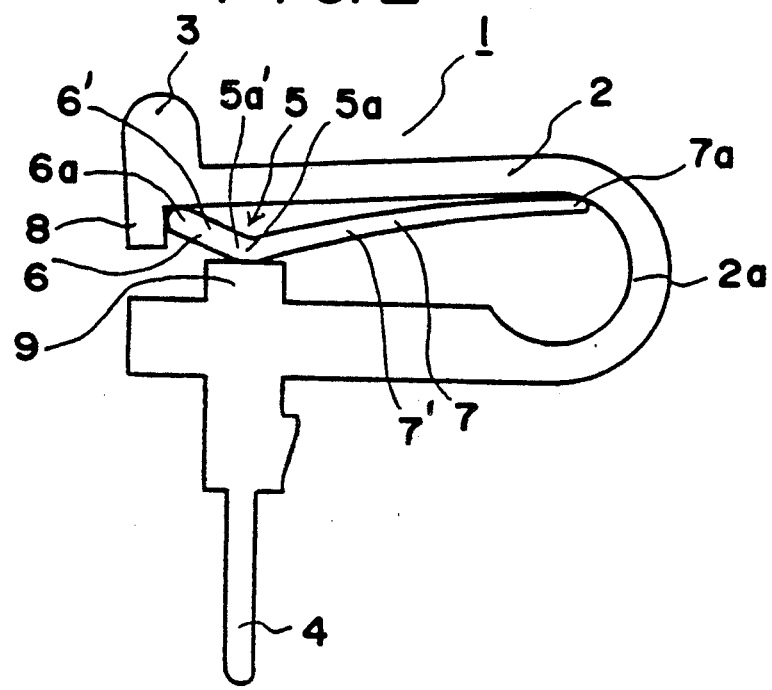
FIG. 2 is a side view showing a displaced state of the contact.
Figure 3:
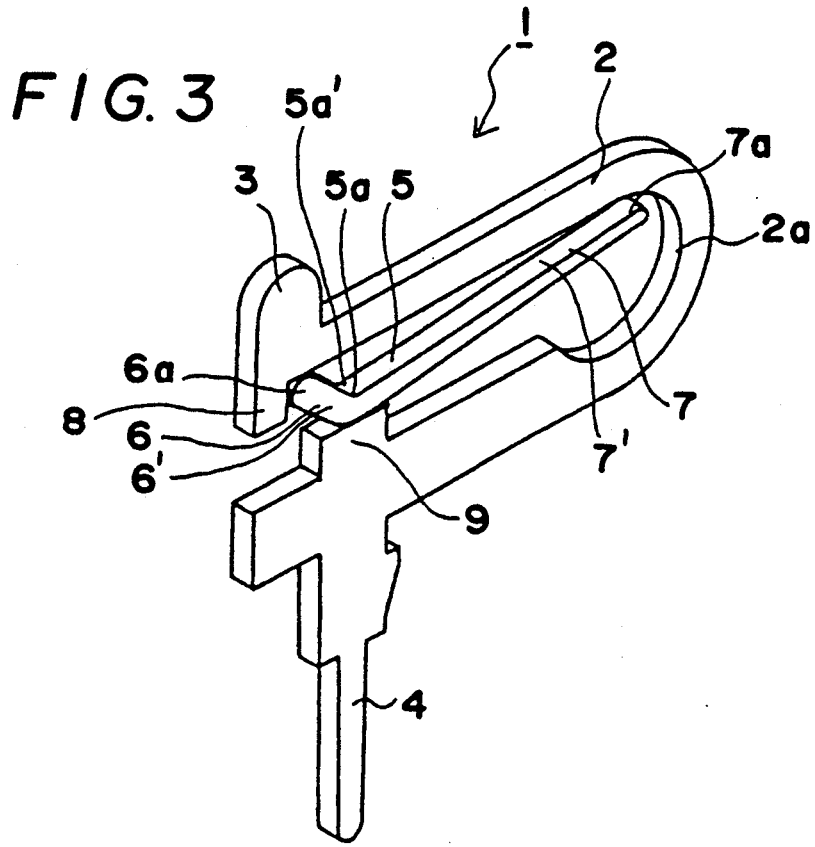
FIG. 3 is a perspective view of the contact.
Figure 4:
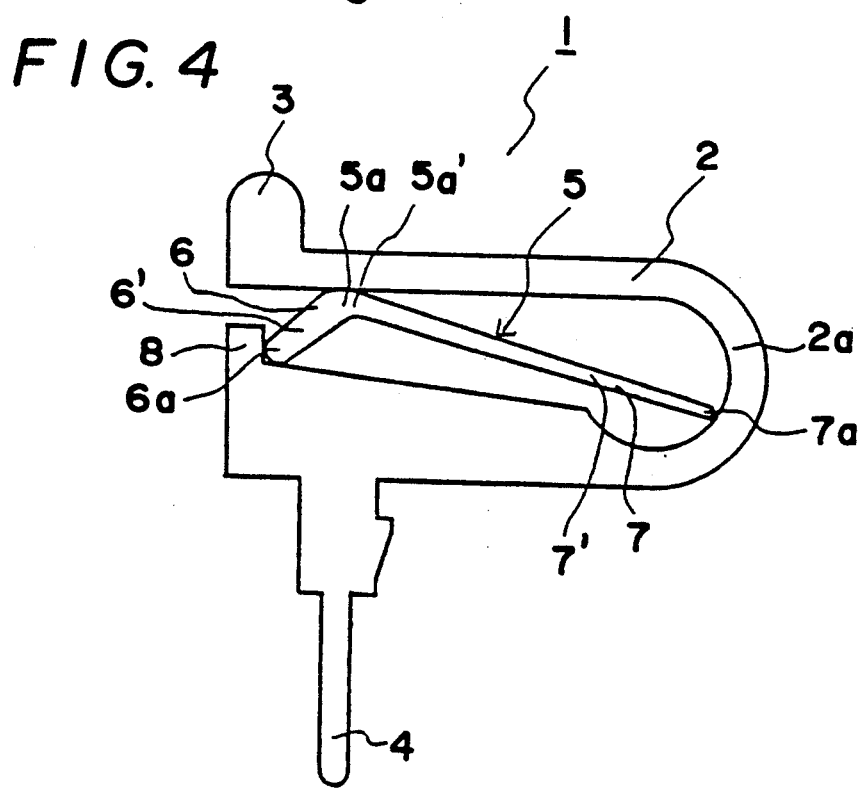
FIG. 4 is a side view of a contact according to another embodiment of the present invention.
Figure 5:
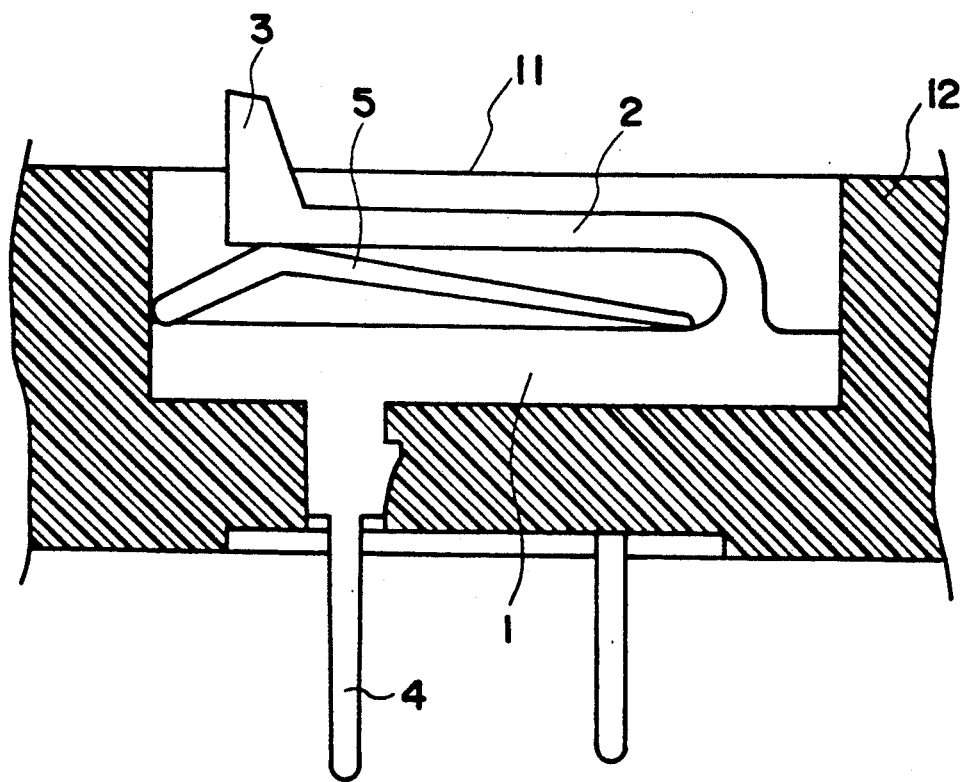
FIG. 5 is a sectional view of a contact according to still another embodiment of the present invention, wherein contacts are arranged in a staggered form on a connector body.

FIGS. 1 through 3 show one embodiment, in which the bent portion 5a' of the horizontal generally V-shaped bypass element 5 is supported by the inner surface on the side of the male terminal 4 of the warped element 2, and the free end 6a of the bent element 6' of one end of the bypass element 5 is supported by the inner surface on the side of the contact portion element 3. FIGS. 4 and 5 show another embodiment in which the horizontal generally V-shaped bypass element 5 is inverted so that the bent portion 5a' is supported on the inner surface on the side of the contact portion element 3 of the warped element 2, and the free end 6a of the bending element 6' of one end of the bypass element 5 is supported by the inner surface on the side of the male terminal 4.

Also, a means is provided for restricting the position of the bypass element 5 within the warped element 2. A displacement stopper 8 is formed, as shown in FIGS. 1 through 3, on the inner surface of one end of the warped element 2 where the contact portion element 3 is provided or, as shown in FIG. 4, on the inner surface of the other end of the warped element 2, in such a manner as to be projected from either inner surface. Also, as is shown in FIGS. 1 through 3, a projection element 9 is provided on the inner surface of the warped element 2 on the side of the other end thereof, so that the bent portion 5a' and the connecting portion 5a of the bypass element 5 are supported by the projection portion 9. In this way, a displacing space of the bypass element 5 can be obtained within the warped element 5.

Either one free end or both free ends 6a and 7a of the bypass element 5 are disposed in such a manner as to be contacted with the inner surface of the warped element 2 from the beginning or in a noncontacted state so that when the contact portion element 3 is displaced downward, it is brought to be contacted with the inner surface of the warped element 2 and bent. The present invention includes any of the above mentioned cases.

Figure 6:
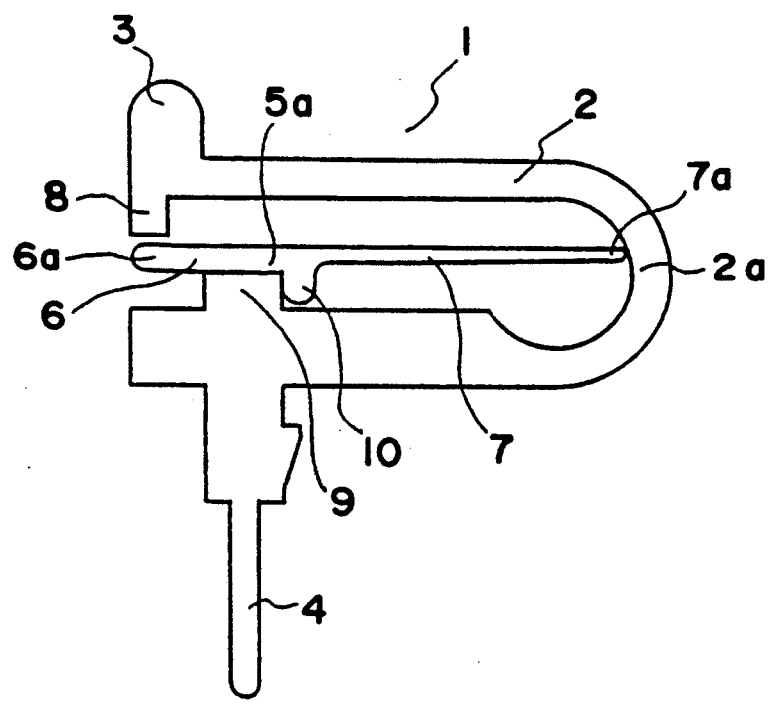
FIG. 6 is a side view of a contact according to yet another embodiment of the present invention.

Also, as is shown in FIG. 6, the bypass element 5 is formed into a simple straight bar and disposed within the warped element 2 in the manner illustrated. In addition, a projection element 10 is formed, as a displacement stopper means in the vicinity of the connecting portion 5a in order to restrict the position by engagement with the projection element 9.

The bypass element 5 disposed within the warped element 2 is restricted by a partition wall 11, isolating the contacts 1, formed at a connector body 12 so that the bypass element 5 will not sidewise fall off of the contact 1. Also, the contact may be designed such that instead of providing a displacement stopper for the bypass element 5 on the contact, the free end of the bypass element 5, as shown in FIG. 5, is abutted against and supported by the wall of the connector body 12, attaining the same purpose of stopping the displacement of the bypass element 5.

Figure 7A:
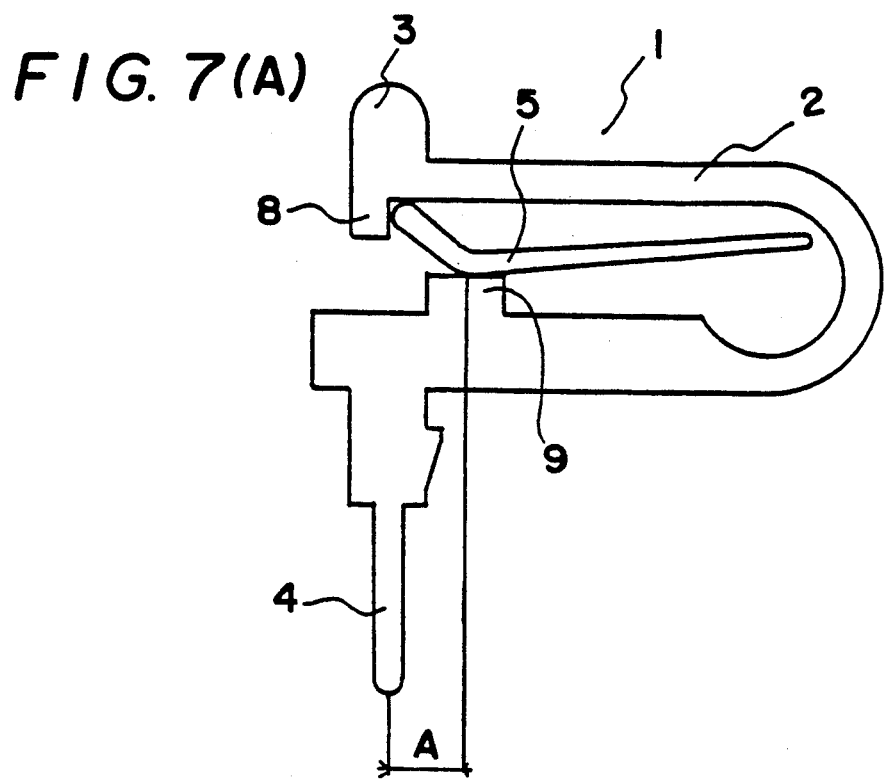
FIGS. 7(A) and 7(B) are side views of a contact showing one example of an arrangement of male terminals when contacts are arrange in a staggered form.
Figure 7B:
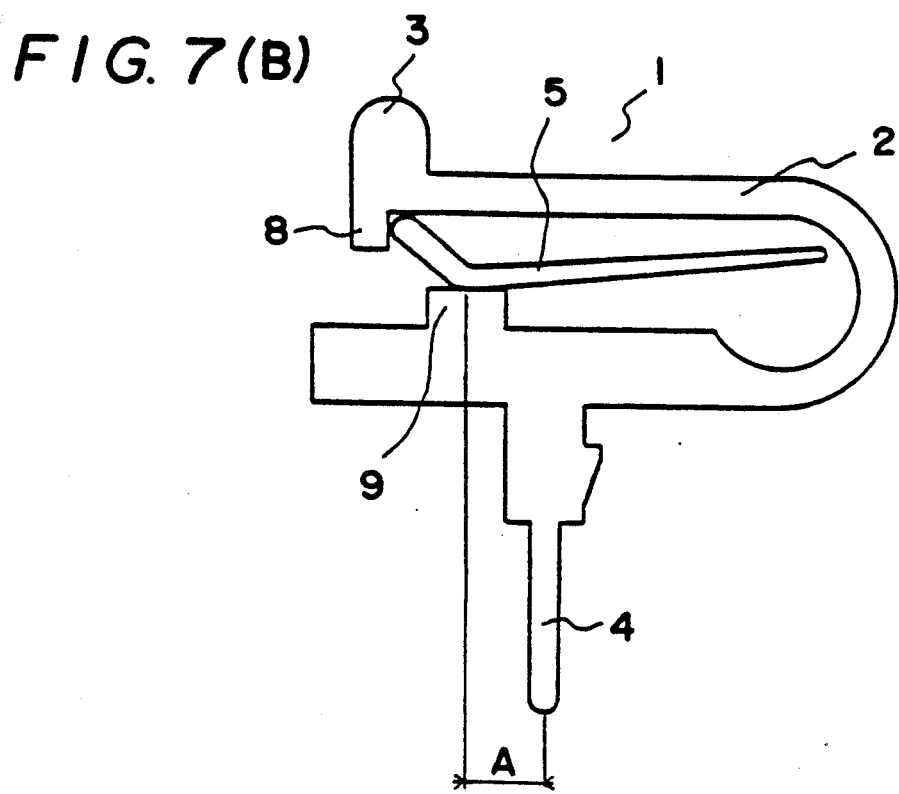

Also, because the contacts 1 are planted in a high density in the connector, in case the contacts 1 are arranged in a staggered form on the connector with the male terminals 4, as shown in FIGS. 7a and 7b, the male terminals 4 of the adjacent contacts 1 are arranged in positions an equal distance A from the connecting portion 5a and the contacting portions on the side of the male terminals of the bent portion 5a' which form the supporting points in order to make the bypass distance uniform.

As described in the foregoing, according to the present invention, when the contact portion element is displaced downward against the elasticity of the warped element upon application of a pushing force on the contct portion element by the contact element of an electric the pushing force is applied to the three points of the free end of the rigid portion element, the free end of the elastic portion element and the connecting portion therebetween, all of the bypass element which is disposed within the warped element, thereby shortening the circuit between the contact portion element and the male terminal through the rigid portion element while elastically bending the same in the opening direction so that the rigid portion element is contacted with the inner surface of the warped element on the side of the male terminal and with the inner surface of the warped element on the side of the contact portion under pressure. As a result, a bypass can be effectively achieved by the rigid portion element by way of the shortest distance while generating a favorable contact pressure.

Also in the invention, from another aspect, a pushing force is applied to the three points of both the free ends and the bent portion of the horizontal generally V-shaped bypass element by the downward displacement of the warped element. As a result, an elastic bending is generated in the opening direction while absorbing the elasticity of the warped element, thereby bringing the bent portion of the bypass element at one end thereof to be contacted with the inner surface of the warped element on the side of the male terminal under pressure. As a result, there can be obtained a favorable pressure contact. In addition, the bypass distance can be made shortest by the bent element, and there can be provided a contact exhibiting a favorable characteristic with respect to a signal of high frequency.

According to the present invention, the intended object can be achieved with ease, simply by disposing a bypass element, which has been prepared as a separate body, within the warped element and without greatly changing the basic construction of the contact, and a contact design can be made with ease.

Although several embodiments of a contact equipped with a bypass element have been described in detail with reference to the accompanying drawings, the present invention is of course not limited to these embodiments. It is to be understood that various changes and modifications can be made within the spirit of the present invention.

What is claimed is:

1. A contact, comprising:
   a warped element having a warped side thereof and an inner surface;
   a contact portion at one end of said warped element;
   a male terminal at the other end of said warped element; and
   a bypass element disposed within said warped element, said bypass element having a rigid portion at one end thereof, an elastic portion at the other end thereof, and a connecting portion between said rigid portion and said elastic portion;

wherein a free end of said rigid portion and a point on said bypass element at said connecting portion are contacted with said inner surface of said warped element between the ends of said warped element to shorten a circuit between said contact portion and said male terminal; and wherein a free end of said elastic portion abuts against the inner surface of said warped element at said warped side of said warped element in order to elastically support said rigid portion.

2. The contact as set forth in claim 1, wherein when a plurality of said male terminals are planted in a staggered form, male terminals of adjacent said contacts are equidistantly arranged from the point whereat the male terminal side of said inner surface of said warped element contacts said bypass element.

3. A contact, comprising:
a warped element having a warped side thereof and an inner surface;
a contact portion at one end of said warped element;
a male terminal at the other end of said warped element; and
an elastic bypass element having a horizontal generally V-shaped configuration disposed within said warped element, said bypass element having a first bent element, a second bent element and a bent portion therebetween, said first bent element having a first free end and said second bent element having a second free end, said bent portion and said first free end being brought into contact with and supported by the inner surface of said warped element between the ends thereof so as to shortcircuit said contact element and said male terminal, said second free end being brought into contact with and supported by the inner surface of said warped element at said warped side thereof.

4. The contact as set forth in claim 3, wherein when a plurality of said male terminals are planted in a staggered form, male terminals of adjacent said contacts are equidistantly arranged from the point whereat the male terminal side of said inner surface of said warped element contacts said bypass element.

* * * * *